US012693555B2

(12) United States Patent
Ramirez et al.

(10) Patent No.: US 12,693,555 B2
(45) Date of Patent: Jul. 28, 2026

(54) WAVELENGTH DIVISION MULTIPLEXING RECEIVER

(71) Applicant: Nokia Solutions and Networks Oy, Espoo (FI)

(72) Inventors: Joan Manel Ramirez, Bures-sur-Yvette (FR); Claire Besancon, Paris (FR)

(73) Assignee: Nokia Solutions and Networks Oy, Espoo (FI)

( * ) Notice: Subject to any disclaimer, the term of this patent is extended or adjusted under 35 U.S.C. 154(b) by 465 days.

(21) Appl. No.: 18/316,599

(22) Filed: May 12, 2023

(65) Prior Publication Data

US 2024/0019722 A1 Jan. 18, 2024

(30) Foreign Application Priority Data

Jul. 18, 2022 (EP) ..................................... 22306069

(51) Int. Cl.
*H04J 14/02* (2006.01)
*C30B 25/04* (2006.01)
*G02F 1/015* (2006.01)
*G02F 1/017* (2006.01)

(52) U.S. Cl.
CPC .......... *G02F 1/01708* (2013.01); *C30B 25/04* (2013.01); *G02F 1/0155* (2021.01); *H04J 14/0227* (2013.01)

(58) Field of Classification Search
CPC .......................... G02F 1/01708; G02F 1/0155; H04J 14/0227; H10F 30/288; H10F 71/127; G02B 6/12004
See application file for complete search history.

(56) References Cited

U.S. PATENT DOCUMENTS 5,210,428 A * 5/1993 Goossen ............. H10F 77/1248
257/17
5,627,383 A * 5/1997 Cunningham ...... H01S 5/18341
257/85
5,949,561 A * 9/1999 Goossen ................. H10F 30/24
398/1
5,977,911 A * 11/1999 Green ...................... H01Q 3/22
342/375

(Continued)

FOREIGN PATENT DOCUMENTS

CA 2330537 A1 * 11/1999 ........... H01S 5/0264
CA 2372904 A1 * 5/2003

(Continued)

*Primary Examiner* — Tanya T Motsinger
(74) *Attorney, Agent, or Firm* — Harness, Dickey & Pierce, P.L.C.

(57) ABSTRACT

A demultiplexer-free wavelength division multiplexing receiver based on cascaded-bandgap waveguide photodiodes, includes a substrate; and a plurality of different absorbing material sections forming a plurality of independent photodetector sections, each with a different thickness and a different bandgap. The plurality of photodetector sections may be fabricated at the same time on the same substrate, whereby different widths between each pair of mask stripes results in a different thickness of each photodetector section and a different bandgap of each photodetector section. The photodetector sections are then optically connected together into concatenated photodetector sections forming a single elongated optical waveguide.

17 Claims, 14 Drawing Sheets

(56)  References Cited

U.S. PATENT DOCUMENTS

| | | | | |
|---|---|---|---|---|
| 6,072,925 | A * | 6/2000 | Sakata | G02F 1/3133 |
| | | | | 398/1 |
| 6,271,943 | B1 * | 8/2001 | Goossen | B82Y 20/00 |
| | | | | 398/9 |
| 7,910,954 | B2 * | 3/2011 | Hansson | H10F 39/1825 |
| | | | | 257/E51.013 |
| 9,494,734 | B1 * | 11/2016 | Jain | G02B 6/122 |
| 12,348,267 | B1 * | 7/2025 | Chaffee | H04B 10/11 |
| 2003/0011840 | A1 * | 1/2003 | Mitra | H01S 3/2383 |
| | | | | 398/79 |
| 2003/0185534 | A1 * | 10/2003 | Kaneko | G02B 6/42 |
| | | | | 385/129 |
| 2005/0094914 | A1 * | 5/2005 | Gines | G02F 1/01708 |
| | | | | 385/1 |
| 2010/0102409 | A1 * | 4/2010 | Hansson | H10F 39/1825 |
| | | | | 257/432 |
| 2015/0028216 | A1 * | 1/2015 | Camargo | G01S 3/781 |
| | | | | 250/349 |
| 2024/0019722 | A1 * | 1/2024 | Ramirez | C30B 25/04 |
| 2025/0094380 | A1 * | 3/2025 | Mazed | G01S 17/08 |
| 2025/0224575 | A1 * | 7/2025 | Chang | G02B 6/4214 |

FOREIGN PATENT DOCUMENTS

| | | | | | |
|---|---|---|---|---|---|
| EP | 1367651 | A2 * | 12/2003 | | H10F 77/146 |
| JP | H09153638 | A * | 6/1997 | | |

* cited by examiner

FIG. 5C $Wm_1$ $Wm_1 < Wm_2 \implies e_1 < e_2 \implies \lambda_1 < \lambda_2$

WAVELENGTH DIVISION MULTIPLEXING RECEIVER

This application claims priority to and the benefit of European Patent Application No. 22306069.0 filed on Jun. 18, 2022, the entire contents of each of which are incorporated herein by reference.

TECHNICAL FIELD

The present disclosure relates to a wavelength division multiplexing receiver, and in particular to a demultiplexer-free wavelength division multiplexing receiver based on cascaded-bandgap waveguide photodiodes.

BACKGROUND

Optical interconnects have the potential of replacing electrical interconnects in Data Centers Short Reach Optical Links as they offer higher bandwidth and lower power operation. Wavelength Division Multiplexing (WDM) systems are of particular interest for uncooled operation of 8×25G optical transmitters used in Data Centers to replace existing Vertical Cavity Surface Emitting Lasers (VCSEL) which are limited in bandwidth and reach.

Present WDM receivers typically require a demultiplexer in order to discriminate each received signal from the transmitters before converting the information into electrical signals. This technology is not compact An object of embodiments of the present disclosure is to provide a demultiplexer-free wavelength division multiplexing receiver.

SUMMARY

Accordingly, a first exemplary apparatus includes a wavelength division multiplexor (WDM) photodetector receiver, comprising: cascaded-bandgap waveguide photodetector sections with multiple concatenated bandgaps, arranged from lowest wavelength to highest wavelength, based on Multiple Quantum Well (MQW) absorbing media, each photodetector section, configured for a different single wavelength in bandgap and length.

In any of the aforementioned embodiments the photodetector sections may be configured longer than required to absorb the different single wavelength to reduce cross-talk.

In any of the aforementioned embodiments, the WDM photodetector receiver may further comprise an upper layer comprising one of a p-doped material or an n-doped material covering the optical waveguide; and a substrate supporting the photodetector sections, which is p-doped or n-doped; wherein the upper layer, the optical waveguide and the substrate comprise a PIN junction.

In any of the aforementioned embodiments each photodetector section may have substantially the same width, and wherein each photodetection section may have a different thickness.

In any of the aforementioned embodiments each photodetector section may be isolated electrically from each other via an insulating segment.

In any of the aforementioned embodiments each insulating segment may comprise an implantation of H+ between adjacent photodetector sections.

Accordingly, a first method of fabricating a wavelength division multiplexor (WDM) photodetector receiver, comprises:

2 a) providing a substrate;

b) providing a plurality of pairs of selective mask stripes with a trench therebetween on the substrate, each pair of mask stripes having a different width;

c) providing an absorbing material in each trench forming a plurality of photodetector sections at the same time, whereby the different width of each pair of mask stripes results in a different thickness of each photodetector section and a different bandgap of each photodetector section;

d) separating the plurality of photodetector sections; and e) connecting the plurality of photodetector sections into concatenated photodetector sections forming a single elongated optical waveguide.

In any of the aforementioned embodiments the absorbing material may comprise a quantum structure providing a quantum confined stark effect, such as multiple quantum wells (MQW) or quantum dots (QDs).

In any of the aforementioned embodiments step c) may include selective area growth (SAG) such as by metalorganic vapor phase epitaxy (MOVPE).

In any of the aforementioned embodiments the method may further comprise covering the optical waveguide with an upper layer comprising one of a p-doped material or an n-doped material; wherein the substrate may be p-doped or n-doped; and wherein the upper layer, the optical waveguide and the substrate may comprise a PIN junction.

In any of the aforementioned embodiments step e) may include positioning a waveguide-defining mask over the absorbing material forming the plurality of photodetector sections and etching each side thereof to form the single optical waveguide.

In any of the aforementioned embodiments step b) may include forming each trench about the same width.

In any of the aforementioned embodiments step b) may comprise coating the substrate with a masking material, and selectively etching the pairs of selective mask stripes from the masking material.

In any of the aforementioned embodiments the method may further comprises implanting H+ between adjacent photodetector sections for electrically insulating each photodetector section.

In any of the aforementioned embodiments the method may further comprise configuring the bandgap of each photodetector section based on an operating temperature range of the WDM photodetector receiver.

BRIEF DESCRIPTION OF THE DRAWINGS

Some example embodiments will be described in greater detail with reference to the accompanying drawings, wherein:

FIG. 5A to 5J illustrate steps in an exemplary fabrication method of the photodetector receiver of FIG. 3;

DETAILED DESCRIPTION

While the present teachings are described in conjunction with various embodiments and examples, it is not intended that the present teachings be limited to such embodiments. On the contrary, the present teachings encompass various alternatives and equivalents, as will be appreciated by those of skill in the art.

A receiver 5, optically connected to a transmitter 10 via an optical network 6 includes a WDM photodetector receiver 21 based on cascaded-bandgap waveguide photodiodes, resulting in a compact waveguide photodetector receiver 21 with multiple concatenated bandgaps based on Multiple Quantum Well (MQW) absorbing media, for efficient multi-wavelength absorption. Each photodetector section, e.g. PD1 to PD4, may be optimized for a different single wavelength in bandgap and length, hence enabling a con-catenated, wavelength-selective and highly compact photo-detection in a single waveguide. The different MQW based absorbing media enable an adapted responsivity for each wavelength, e.g. $\lambda_1$ to $\lambda_4$, received by the receiver and which match the wavelengths earlier emitted by the transmitters, e.g. transmitters 1-4, whereby this technology does not require any demultiplexer system. In alternate examples, the absorbing media comprises other absorbing media showing a quantum confined stark effect, which is a physical phe-nomenon that shifts the absorption band edge under an external electrical field to absorb the wavelength in the PD sections when an electric bias is applied, such as quantum dots (QDs).

Figure 1:
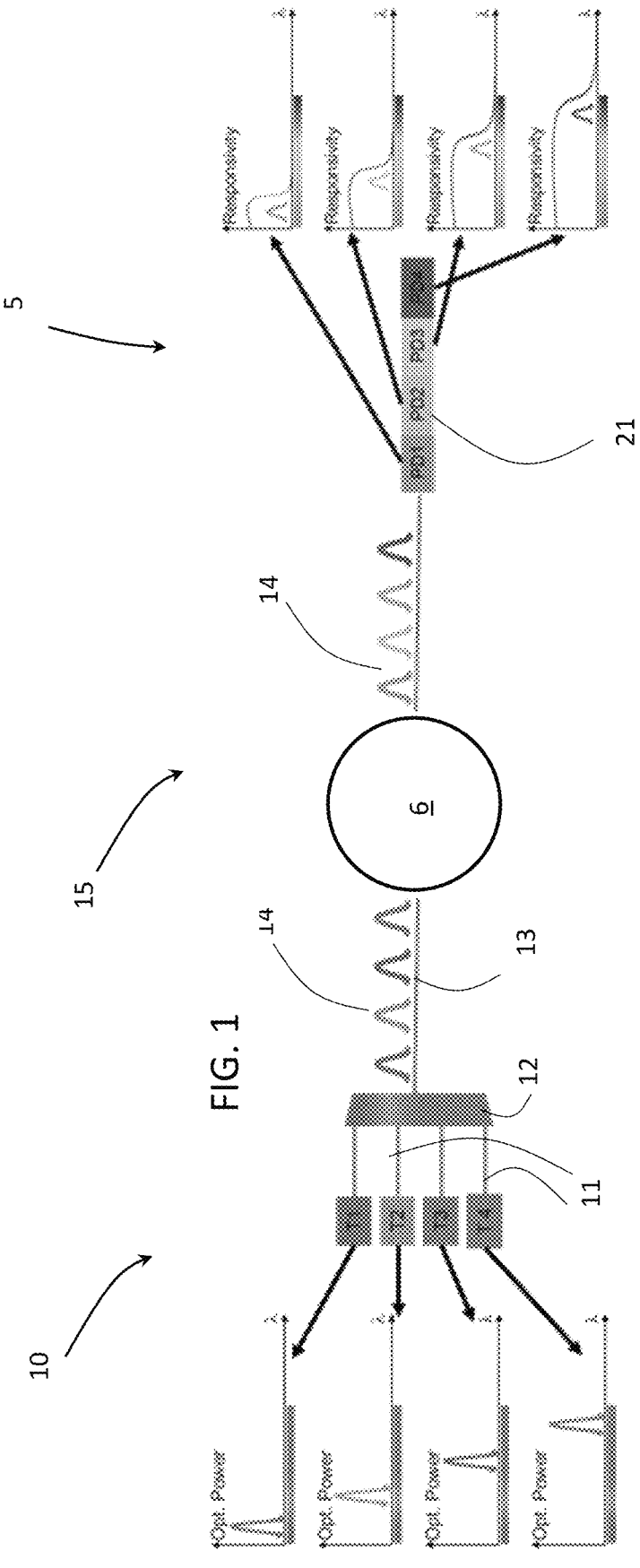
FIG. 1 is a schematic diagram of an exemplary WDM communication system comprising a receiver in accordance with the present disclosure.

An exemplary WDM, e.g. four-channel, system 15, illus-trated in FIG. 1, includes the transmitter 10 including a plurality, e.g. four, of transmitters (1-4), each generating and transmitting an optical signal with a different wavelength, e.g. $\lambda_1$ to $\lambda_4$, of light. In some examples the transmitters T1-T4 are distributed feedback (DFB) lasers, each one of them transmitting an optical signal containing data. Each optical signal is transmitted via optical waveguides 11 to a multiplexer 12 in order to be combined and transmitted simultaneously as a WDM signal 14 into a single network waveguide 13 for transmission over the optical network 6.

Figure 2:
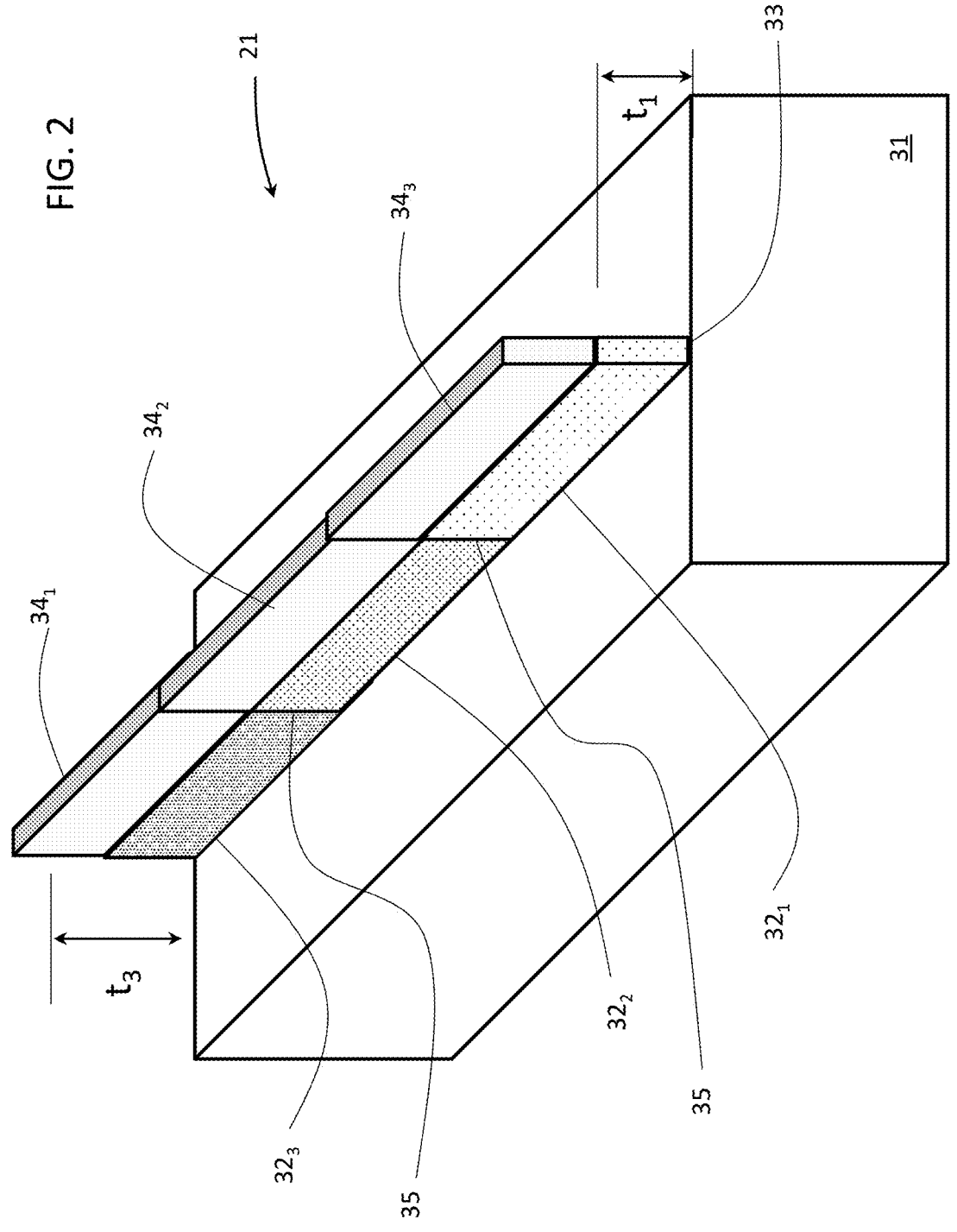
FIG. 2 is an isometric view of an exemplary photodetector receiver of the receiver of FIG. 1.

With reference to FIG. 2, an example of the WDM photodetector receiver 21 includes a substrate 31 supporting the plurality of concatenated photodetector sections, e.g. PD1 to PD3, each of the plurality of concatenated photode-tector sections comprising a differently-sized, e.g. thickness and/or width, absorbing media structures $32_1$ to $32_3$, e.g. MQW, configured to provide a different responsivity for different wavelengths of light. In particular, each of the plurality of absorbing media structures $32_1$ to $32_3$ is config-ured to provide a peak responsivity for a selected emission wavelength, e.g. one of the wavelengths $\lambda_1$ to $\lambda_3$ from the optical signal transmitted from the transmitter 10. An optical waveguide 33, optically coupled to the optical network, e.g. the network waveguide 13, and comprised of a waveguide material, e.g. silicon, InP, suitable for transmission of the optical wavelengths $\lambda_1$ to $\lambda_3$, extends down the middle of the plurality of absorbing media structures $32_1$ to $32_3$ for trans-mission of the WDM signal 14. Upper contacts $34_1$ to $34_n$, e.g. a p-doped or an n-doped semiconductor, such as n+ or p+ Indium Phosphide (InP) or Indium Gallium Arsenide (InGaAs), may be mounted on top of the absorbing media structures $32_1$ to $32_3$ configured for transmitting electrical signals from the absorbing media structures $32_1$ to $32_3$. The substrate 31 may include a dopant, e.g. n-doped or p-doped, whereby the substrate 31 is configured as a second contact in a PIN junction for completing the electrical circuit. Metal electrodes, not shown, may be provided on top of the upper contacts $34_1$ to $34_n$ and at the bottom of the substrate 31 to facilitate transmission of the electrical signals. Each photo-detector section, e.g. PD1 to PD3, is isolated electrically from each other via an insulating segment 35. The insulating segments 35 may be formed using standard and well-known techniques, e.g. etching of the upper contacts $34_1$ to $34_n$, and implantation of H+ between each photodetector section, e.g. PD1 to PD3. However, other forms of electrical insulation may be provided, e.g. by performing an etching step to form trenches between the photodetector sections, and a passiva-tion of the trenches with a dielectric, e.g. oxide, layer, such as $SiO_2$ or InAlAs.

Figure 3:
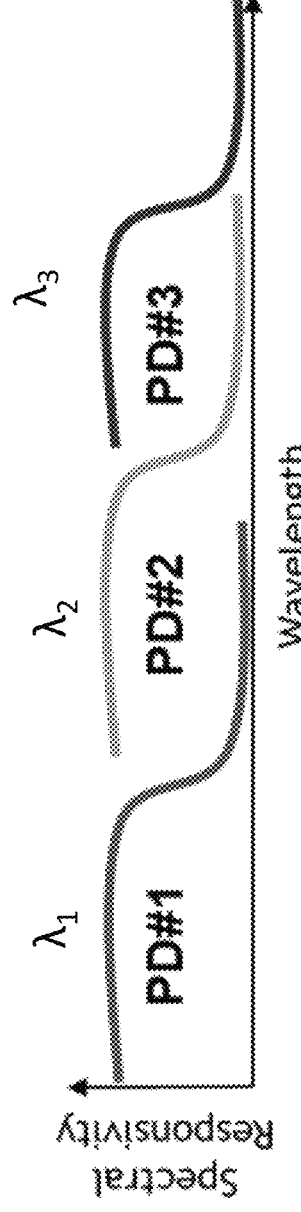
FIG. 3 illustrates an exemplary plot of wavelength vs spectral responsivity for the photodetector receiver of FIG. 2.

With reference to FIG. 3, the WDM signal 14 with the plurality of, e.g. three, different wavelengths, e.g. $\lambda_1$ to $\lambda_3$, is propagated in the passive optical waveguide 33, e.g. fabricated using InP technology, silicon photonics or other suitable platforms. In some embodiments, the optical wave-guide 33 comprises a PIN junction (P-doped region/intrinsic region/N-doped region), with the multiple quantum wells placed in the intrinsic region, i.e. in the middle. Alterna-tively, the optical waveguide 33 comprises a PN junction. Then, the optical mode having the smallest wavelength $\lambda_1$, i.e. the highest energy, will be substantially completely absorbed and converted into a first electrical signal by the first photodetector section PD1, if the length and bandgap of such is optimized. The other two modes $\lambda_2$ and $\lambda_3$ will pass through the first photodetector section PD1 without being absorbed because they have higher wavelengths, i.e. smaller energy. The same will happen in sequence with the second photodetector section PD2, i.e. the second wavelength $\lambda_2$, with a larger wavelength than the first wavelength $\lambda_1$, but a smaller wavelength than the third wavelength $\lambda_3$, is sub-stantially completely absorbed and converted into a second electrical signal by the second PD2, and the third photode-tector section PD3, i.e. the third wavelength $\lambda_3$, with a larger wavelength than the second wavelength $\lambda_2$, is substantially completely absorbed and converted into a third electrical signal by the third PD3. All the optical modes will be absorbed in a sequential manner, one after the other, and no optical signal will remain at the end of the third photode-tector section PD3.

The last photodetector, e.g. PD3 or PD4, may not receive substantially less optical power than the previous photode-tectors, since the transmitted wavelength, e.g. $\lambda_3$ or $\lambda_4$, has a wavelength which is transparent for the previous photo-detectors, e.g. PDs1 and PD2. The only additional losses that PD4 will have to deal with are the propagation losses caused by a slightly longer optical path than the other signals. Such propagation losses, induced by light scattering at the wave-guide edges due to surface roughness are typically of a few dB/cm. For example: for a 3 dB/cm loss, which is a standard value in these systems, with each PD 100 μm long (standard length for a waveguide PD) plus the electrically isolated section of 10-20 μm, results in an extra optical path of 360 μm for the 4-CWDM system with 4 PDs, which means an extra propagation loss of about 0.1 dB with respect to the first photodetector PD1. Even by cascading 40 PDs for 40 different wavelengths there would only be an additional propagation loss of 1 dB, which is typically easy to handle in a photoreceiver.

The crosstalk can be minimized by optimizing the bandgap and length of each PD section in order to fully absorb the wavelength from which it has been designed for. In some embodiments one or more of the PD sections, i.e. the absorbing media structures $32_1$ to $32_3$, are configured to be slightly longer than required to fully absorb the optical signal to set up a security margin to make sure that fluctuations in transmitter power resulting in cross-talk between PD sections is not an issue. For example, if a PD section fully absorbs an optical signal with $\lambda=1310$ nm in 100 μm, the PD section may be made 120 μm long to guarantee that the 100% of the optical signal will be absorbed in the PD section. This will introduce a marginal additional length in the receiver 2, but will make the system very robust over cross-talk with negligible impact on the other wavelengths that will be transmitted therethrough, e.g. only an additional optical length of 20 μm per PD section, which is very small. Accordingly, each PD section, will provide an independent electrical signal related only to the absorbed wavelength.

The WDM photodetector receiver 21 may be based on selective area growth (SAG) manufacturing technology. Selective area growth (SAG) by metalorganic vapor phase epitaxy (MOVPE), is one of the most attractive methods to develop bandgap-tunable photonic optical devices with a very high integration density and using a single regrowth step. Other epitaxy systems, which rely on high work pressure, e.g. at least 150 mbar, may be used in order to ensure diffusion of the species. By the precise design of mask geometry, for example by positioning a pair of selective mask stripes $41_1$ to $41_n$, one on each side of a SAG region $42_1$ to $42_n$ and each pair having a different width $W_1$ to $W_n$, different MQW absorbing media structures $32_1$ to $32_n$, in terms of one or more of thicknesses, width and compositions, may be grown on the same substrate 31. The selective mask stripes $41_1$ to $41_n$ may be comprised of a dielectric, such as silicon dioxide (SiO$_2$) or silicon nitride (SiN$_4$), For example, with reference to FIG. 4, varying the widths $W_1$ to $W_n$, e.g. from 5 μm to 30 μm, typically in increments of 5 μm, enables 8 to 10 different optical signal wavelengths $\lambda_1$ to $\lambda_n$, e.g. 1490 nm to 1650 nm, with a spacing of 15 μm to 40 μm, preferably 20 μm to 30 μm to be independently detected. In particular, for MQW absorbing media structures $32_1$ to $32_n$, a photoluminescence range of at least 240 nm was successfully obtained from a single SAG step.

Figure 4:
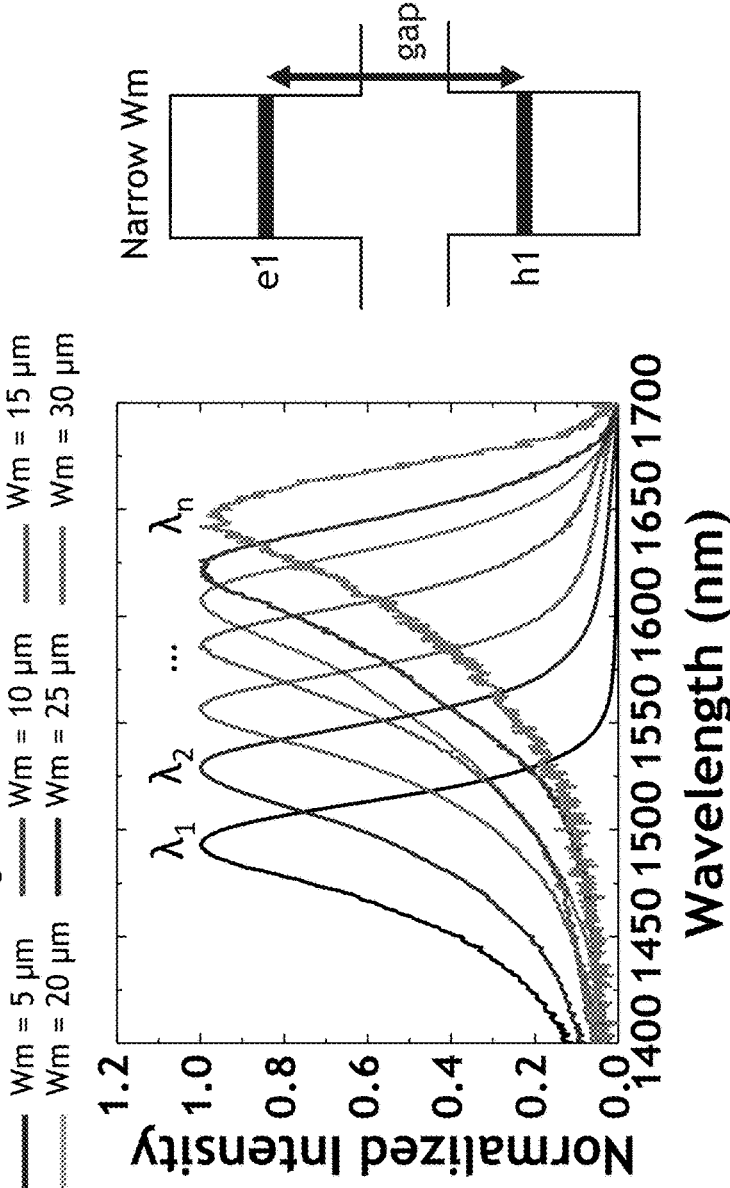
FIG. 4 is an exemplary plot of wavelength (nm) vs intensity (a.u.) for a plurality of mask stripe widths used in the fabrication of the photodetector receiver of FIG. 3.

With reference to the boxes in FIG. 4, for the quantum structures, the main lines correspond to the energy levels of the bulk material, and the levels e1 and h1 define the bandgap (in energy) of the quantum wells. As the width $W_1$ to $W_n$ of the selective mask stripes $41_1$ to $41_n$ increase, the well thickness $t_1$ to $t_n$ increases, and the photoluminescent (PL) emission approaches the one of the bulk material, as the quantum level inside the well, e.g. e1, decreases in energy. However, narrowing the width $W_1$ to $W_n$ of the selective mask stripes $41_1$ to $41_n$ results in the thinning of the quantum wells, and an increase in the bandgap, i.e. the horizontal lines defining levels e1 and h1 separate from each other. Accordingly, when the thickness of the quantum wells is increased, the horizontal lines defining levels e1 and h1 get closer together, i.e. decreasing the bandgap. In the end the PL emission is defined by the bandgap, as an electron from the highest horizontal line e1 will recombine with a hole placed at the line h1 at the bottom.

The masks stripes $41_1$ to $41_n$ used in SAG may be an amorphous dielectric, such as SiO$_2$ or SiN$_4$, which is deposited on the, e.g. semiconductor, substrate 31. The patterns in the selective mask stripes $41_1$ to $41_n$ may be fabricated using microfabrication techniques, such as lithography and etching. The techniques depend on the pattern feature size and used materials. Electron beam lithography may be used due to its nanometer resolution, but may not be necessary since the selective mask stripes $41_1$ to $41_n$ are at least 2 μm wide. The selective mask stripes $41_1$ to $41_n$ should withstand the high temperature growth conditions of semiconductors in order to limit the growth to the pattern, e.g. the SAG region $42_1$ to $42_n$, in between the selective mask stripes $41_1$ to $41_n$. Selectivity of the growth is originated from the property that atoms in the material don't favor sticking to the selective mask stripes $41_1$ to $41_n$, i.e. the mask stripes $41_1$ to $41_n$ have a low sticking coefficient with the material. Sticking coefficient can be reduced by the choice of mask material, having lower material flow and having higher growth temperature. High selectivity i.e. no growth, on the selective mask stripes $41_1$ to $41_n$ is desired.

With reference to FIGS. 5A to 5J and 6, an exemplary fabrication process begins with step 101, the provision of the substrate 31 (FIG. 5A), e.g. comprising a semiconductor material such as silicon or InP. In the next step 102, a masking layer 52 of the selective masking material is deposited on the substrate 31, typically 100 nm thick masking layer 52 is enough, and patterned, e.g. etched, to form the selective mask stripes $41_1$ to $41_n$ (FIG. 5B) with the SAG regions $42_1$ to $42_n$ therebetween. The widths $W_1$ to $W_n$ of the selective mask stripes $41_1$ to $41_n$ are selected based on the desired thickness $t_1$ to $t_n$ of the absorbing media structures $32_1$ to $32_n$ formed in the plurality of SAG regions $42_1$ to 42, respectively, i.e. the desired photoluminescence of each photodetector section, e.g. PD1 to PDn. In step 103, the MQW material is epitaxially grown, e.g. metalorganic vapor phase epitaxy (MOVPE).

With reference to FIG. 5C, the epitaxial growth step 103 introduces the different MQW material elements, e.g. Al, Ga, In, into a chamber in which the substrate 31 with the selective mask stripes $41_1$ to $41_n$ is positioned. The MQW material elements have a certain diffusion length, and are looking for a specific crystalline structure to attach onto, hence contributing to the crystalline growth. When the MQW material elements find the amorphous selective mask stripes $41_1$ to $41_n$, they travel along them until they encounter a crystalline layer. Essentially, when the crystalline substrate 31 is covered with amorphous mask stripes $41_1$ to $41_n$, all the MQW material elements that would have been attached to this area are spread at each side of the mask stripes $41_1$ to $41_n$, to attach to the exposed crystalline areas, i.e. the SAG regions $42_1$ to $42_n$ therebetween. Accordingly, when the width W of the mask stripes $41_1$ to $41_n$ is increased, more MQW material will attach to the SAG regions $42_1$ to $42_n$ between the pair of mask stripes $41_1$ to $41_n$ since more MQW elements will travel along the amorphous mask stripes $41_1$ to $41_n$ without attaching thereto. Moreover, when a each pair of mask stripes $41_1$ to $41_n$ has a different mask width than the other pairs of masks stripes $41_1$ to $41_n$ the growth rate in the SAG regions $42_1$ to $42_n$ between the different pairs of mask stripes $41_1$ to $41_n$ will be different, resulting in absorbing media structures $32_1$ to $32_n$ formed at the same time with different thicknesses, and therefore different absorbing characteristics, i.e. wavelength.

When the width of the mask stripes $41_1$ to $41_n$ are enlarged, i.e. widened, more and more of the MQW material elements are being directed towards to center of each pair of mask stripes $41_1$ to $41_n$, whereby more of the MQW material is being deposited in the SAG regions $42_1$ to $42_n$. As a consequence, the quantum wells are thicker, which means that the quantum wells get closer and closer to bulk, shifting the PL emission towards the red (in wavelength) end of the optical spectrum. When the opposite is done, i.e. the width of the mask stripes $41_1$ to $41_n$ are narrowed, the PL emission is shifted towards the blue end of the optical spectrum. In this context, the dimensions of the each of the pairs of selective mask stripes $41_1$ to $41_n$ can be adjusted to tune the responsivity of the MQW absorbing media structures $32_1$ to $32_n$, respectively, e.g. corresponding to each wavelength, $\lambda_1$ to $\lambda_n$, of the transmitters, e.g. transmitters 1-4.

Figures 5A, 5B:
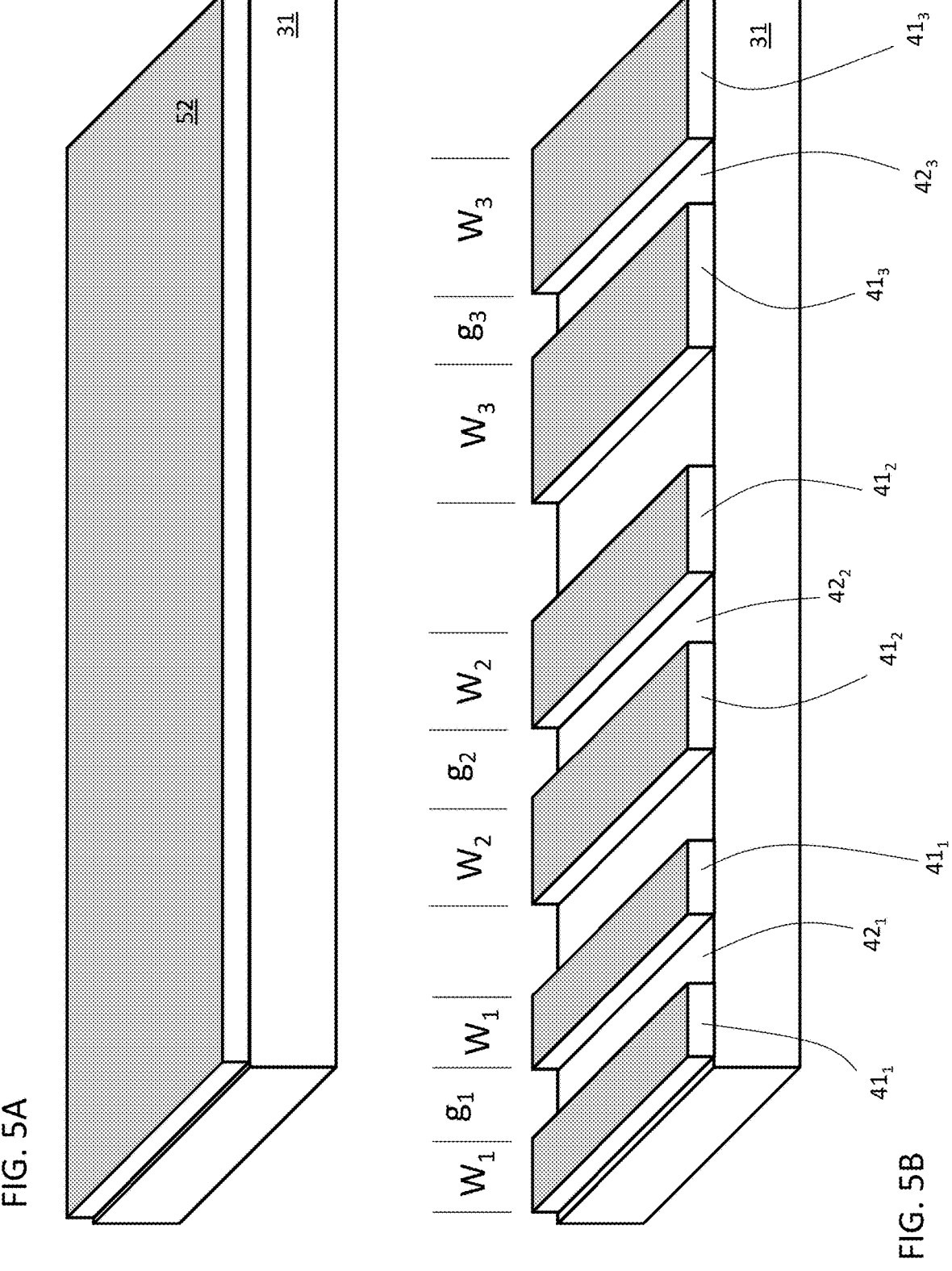
Figure 5C:
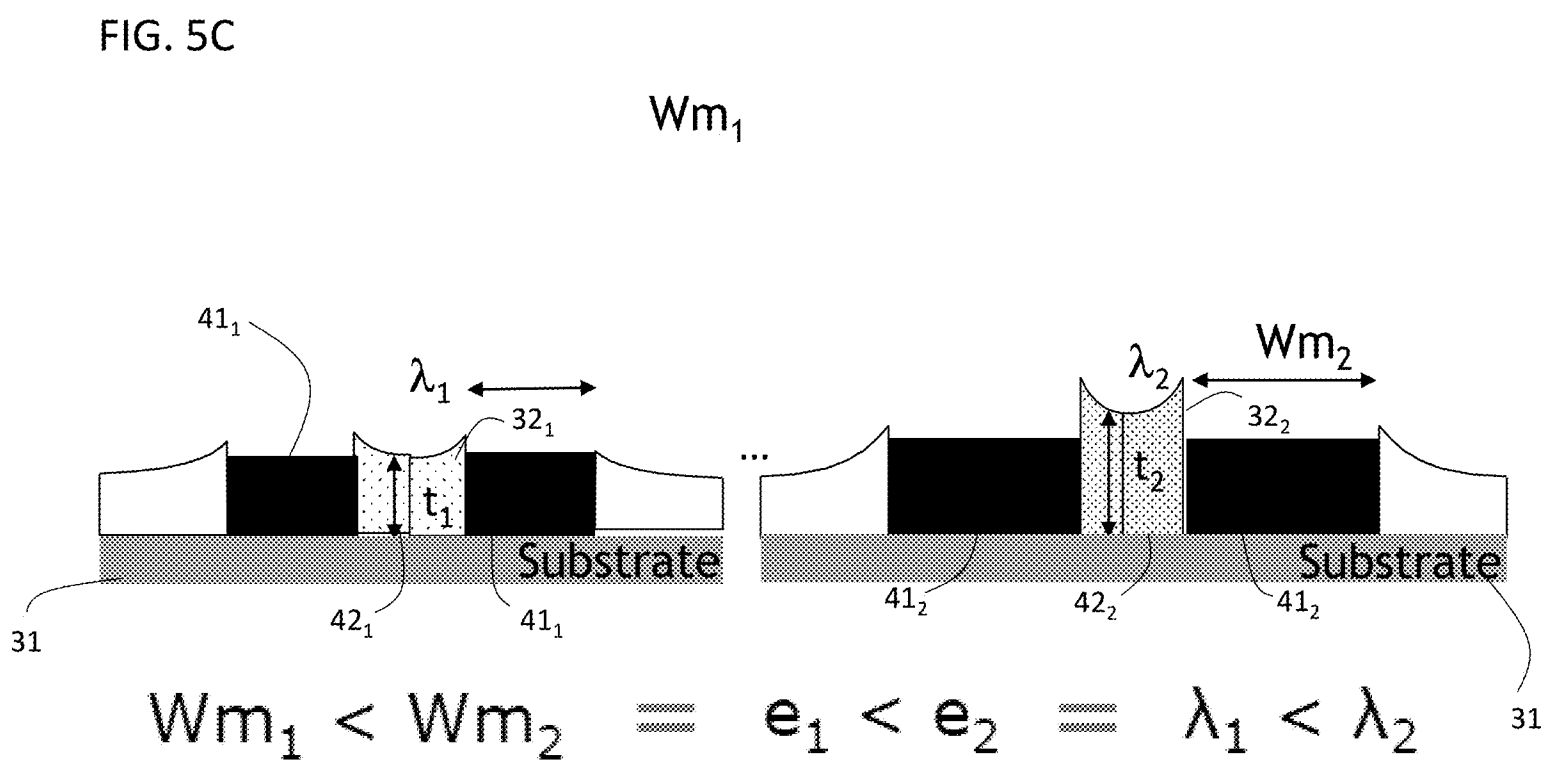
Figure 5D:
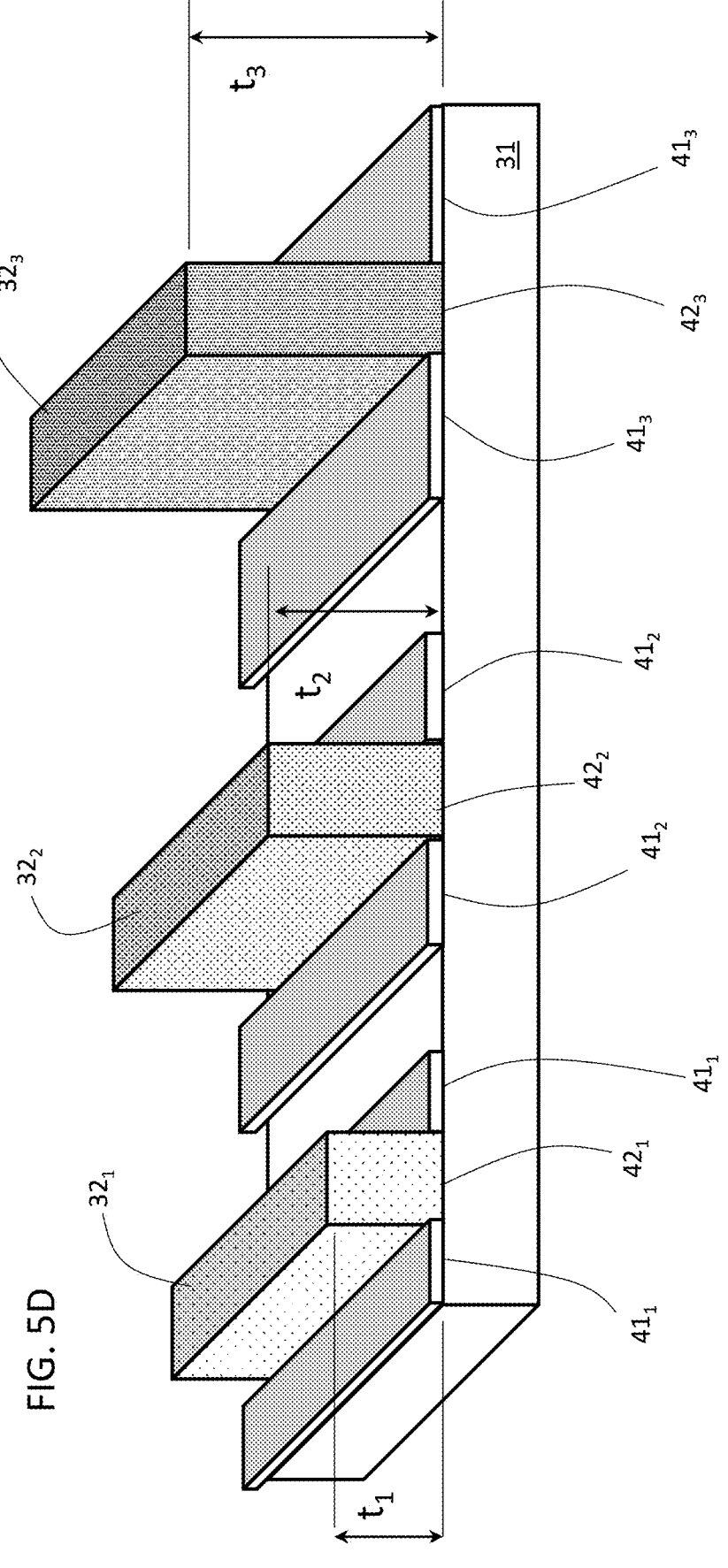
Figures 5E, 5F:
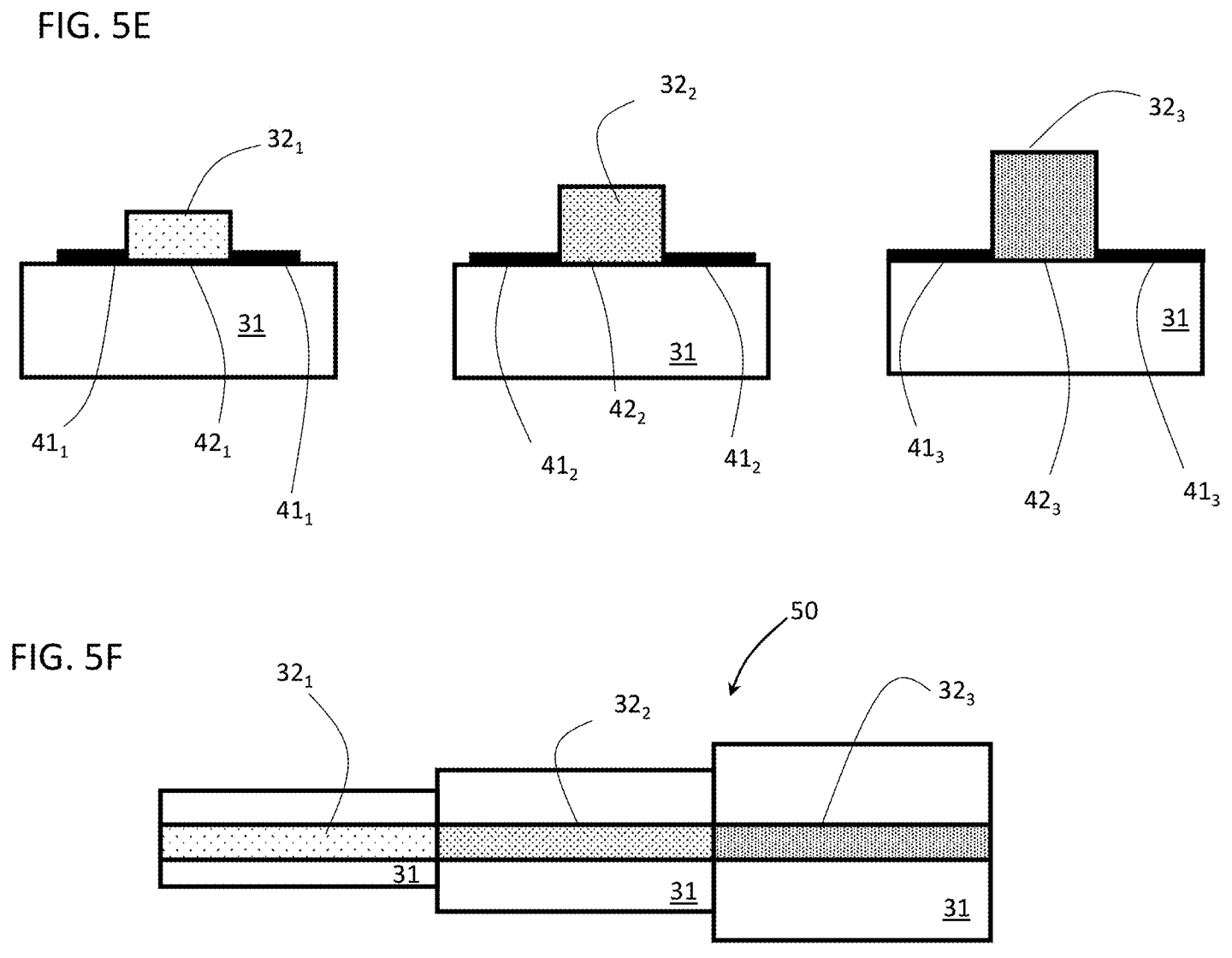

With reference to FIGS. 5D and 5E, step 104 may include removing excess material from between the MQW absorbing media structures $32_1$ to $32_n$ and then the cutting or slicing of the wafer or substrate 31 into individual PD sections, e.g. PD1, PD2 and PD3. Step 105 (FIG. 5F) includes aligning and connecting, e.g. adhesive or some other suitable connecting step, the MQW absorbing media structures $32_1$ to $32_n$ and the sections of the substrate 31 thereunder, i.e. the individual PD sections, into a concatenated compact waveguide base structure 50.

Figure 5G:
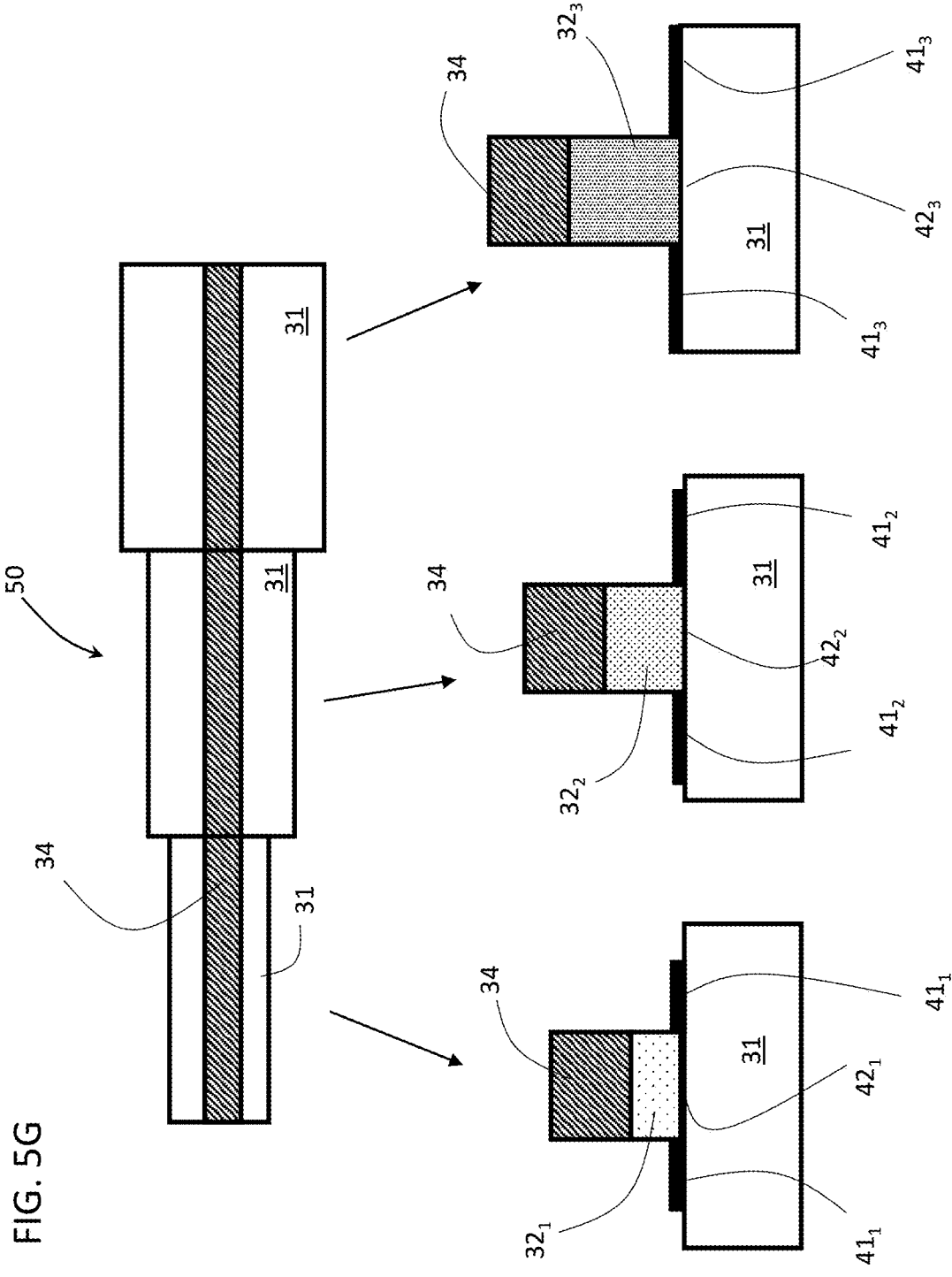

Typically, there may be a few nanometers of variation between MQW absorbing media structures $32_1$ to $32_n$, e.g. up to 20 nm, which is negligible, as a P-doped or an N-doped region, forming the upper contacts $34_1$ to $34_n$, which is typically around of 2 μm thick is provided, e.g. grown, on top of the MQW absorbing media structures $32_1$ to $32_n$ in step 106 (FIG. 5G).

The growth conditions configured in the growth, e.g. epitaxy, chamber for the P-doped region growing step 106 may be adapted and optimized in order to have a minimum thickness variation in the P-region, i.e. the upper contacts $34_1$ to $34_n$, along the concatenated compact waveguide base structure 50. Accordingly, there may be a "SAG mode" in the epitaxy chamber that is used only for the MQW absorbing media structures $32_1$ to $32_n$, which provides maximum thickness differences. Then, once the MQW absorbing media structures $32_1$ to $32_n$ are grown, the epitaxy chamber may be tuned by changing several parameters to a "normal mode", in which the effect of the mask stripes $41_1$ to $41_n$ is minimized, so the P-doped regions, i.e. an upper contact layer 34, have the same thickness. In the end, the difference in thickness along the WDM photodetector receiver 21 may be a few tens of nanometers, which is negligible. In embodiments in which the selective mask stripes $41_1$ to $41_n$ are removed prior to regrowth of the upper contact layer 34 and the upper contacts $34_1$ to $34_n$ there may not be a need to adjust growth conditions since there is no SAG effects.

Figures 5H, 5I, 5J:
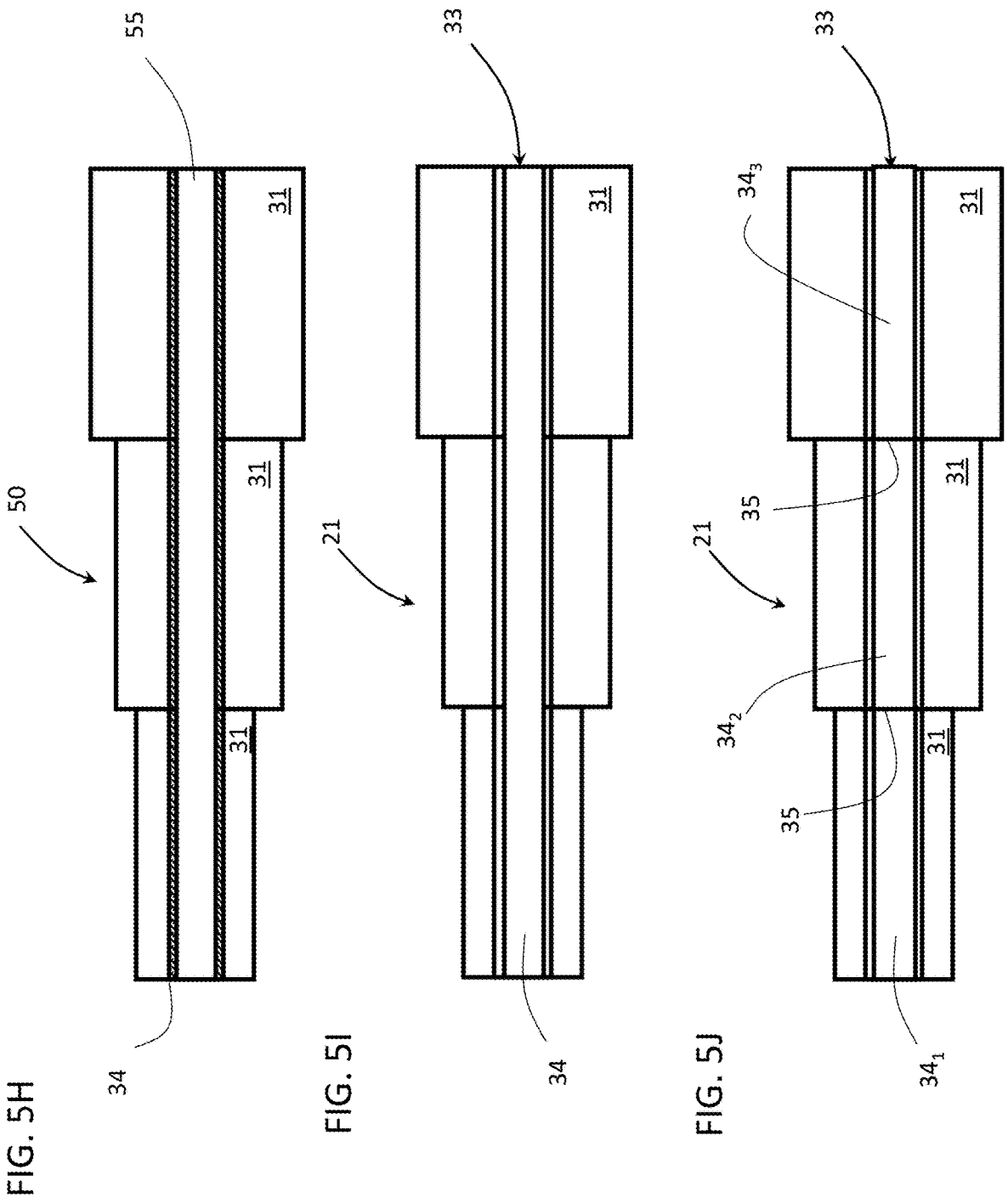
Figure 6:
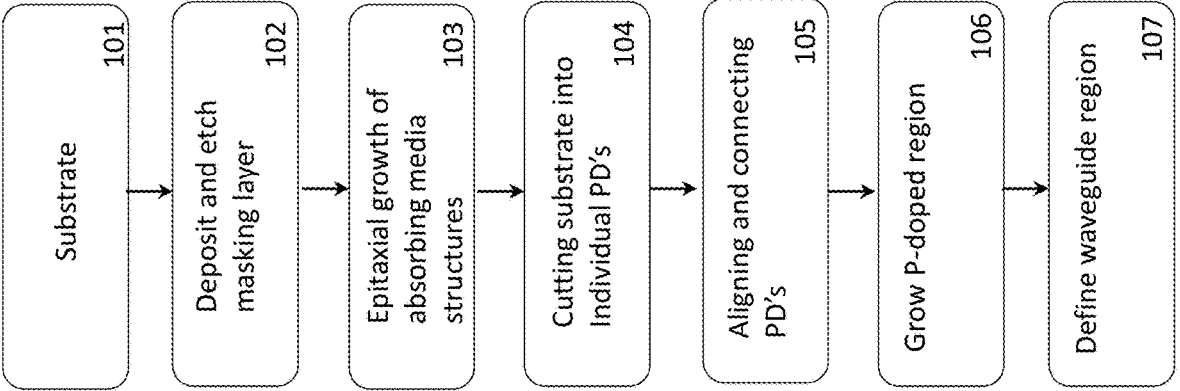
FIG. 6 is a flow chart of the exemplary fabrication method of FIGS. 5A to 5J.

In order to ensure the alignment of the PD sections, e.g. PD1 to PDn, and to ensure that the MQW absorbing media structures $32_1$ to $32_n$ form the continuous optical waveguide 33, e.g. no discontinuities in the side walls, a final waveguide defining etching step (step 107) may be performed after the SAG processing. With reference to FIGS. 5H and 5I, a mask 55, e.g. a standard photolithographic mask, is provided on top of P-doped regions, i.e. the upper contact layer 34, (FIG. 5H), and the waveguide defining etching step is conducted down each side of the waveguide formed by the MQW absorbing media structures $32_1$ to $32_n$ to define the optical waveguide 33, e.g. typically about 0.5 μm to 4 μm wide, preferably about 1 μm to 2 μm wide, from the original trench with the MQW absorbing media structures $32_1$ to $32_n$ being 30 μm wide.

With reference to FIG. 5J, step 107 may include electrically isolating the PD sections, e.g. PD1 to PDn, from each other before or after defining the waveguide 33, typically by etching of the upper contact layer 34 into the individual upper contacts $34_1$ to $34_n$, followed by implantation of an electrically insulating material, e.g. H+, between adjacent PD sections, e.g. PD1 to $PD_n$, forming the insulating segment 35.

Figure 7:
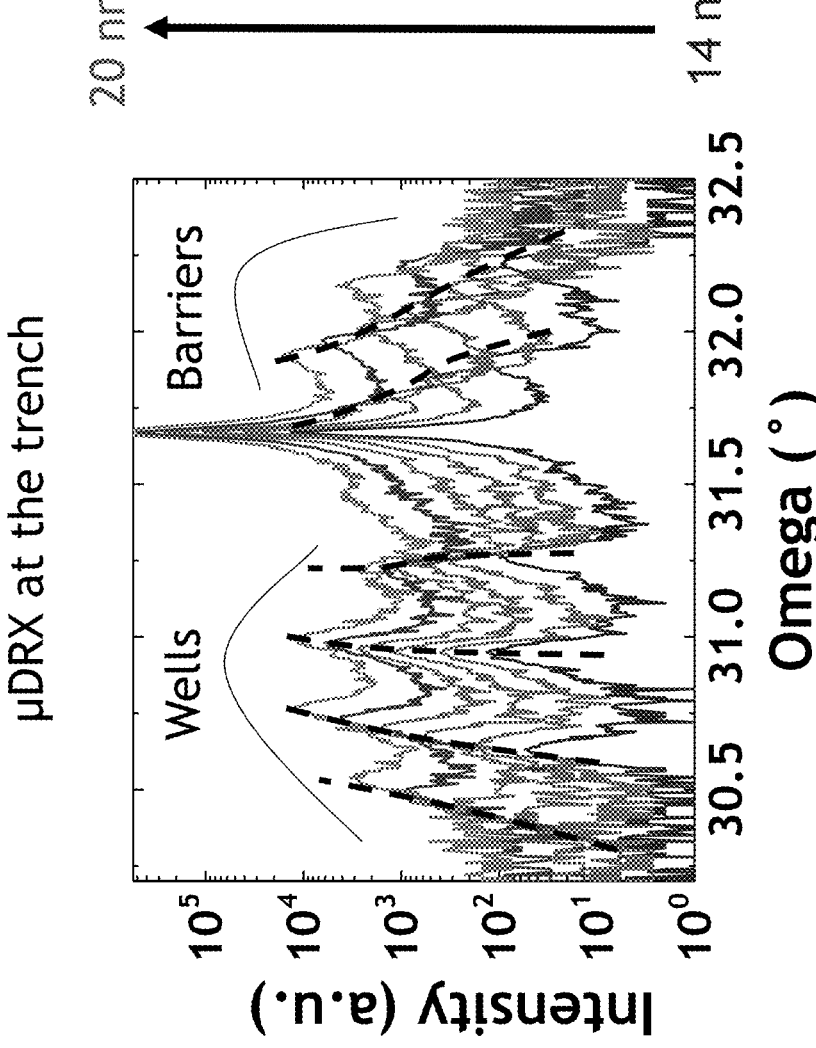
FIG. 7 is a plot of intensity vs degrees for μ-XRD scans of the different gain media.

With reference to FIG. 7, a μ-XRD (x-ray diffraction) analysis at the SAG region $42_1$ to $42_n$ between two mask stripes $41_1$ to $41_n$ evolves as a function of the width of the mask stripes $41_1$ to $41_n$: As illustrated, the peaks corresponding to each MQW absorbing media structures $32_1$ to $32_n$ get closer together as the mask stripes $41_1$ to $41_n$ widen, hence approaching the bulk condition. On the right side of the plot the evolution of the thickness $t_1$ to $t_n$ of the MQW absorbing media structures $32_1$ to $32_n$, from 14 nm for the spectrum at the bottom (no mask) and 20 nm for the widest mask stripes $41_n$ (Wm=30 μm), top spectrum. Accordingly, the responsivity of the WDM photodetector receiver 21, i.e. the responsivity to the specific wavelengths in each PD section, and the spacing of the selected emission wavelengths, e.g. the wavelengths $\lambda_1$ to $\lambda_n$, of the various PD sections can be tuned and adjusted by varying the widths and the relative widths of the mask stripes $41_1$ to $41_n$.

Figure 8:
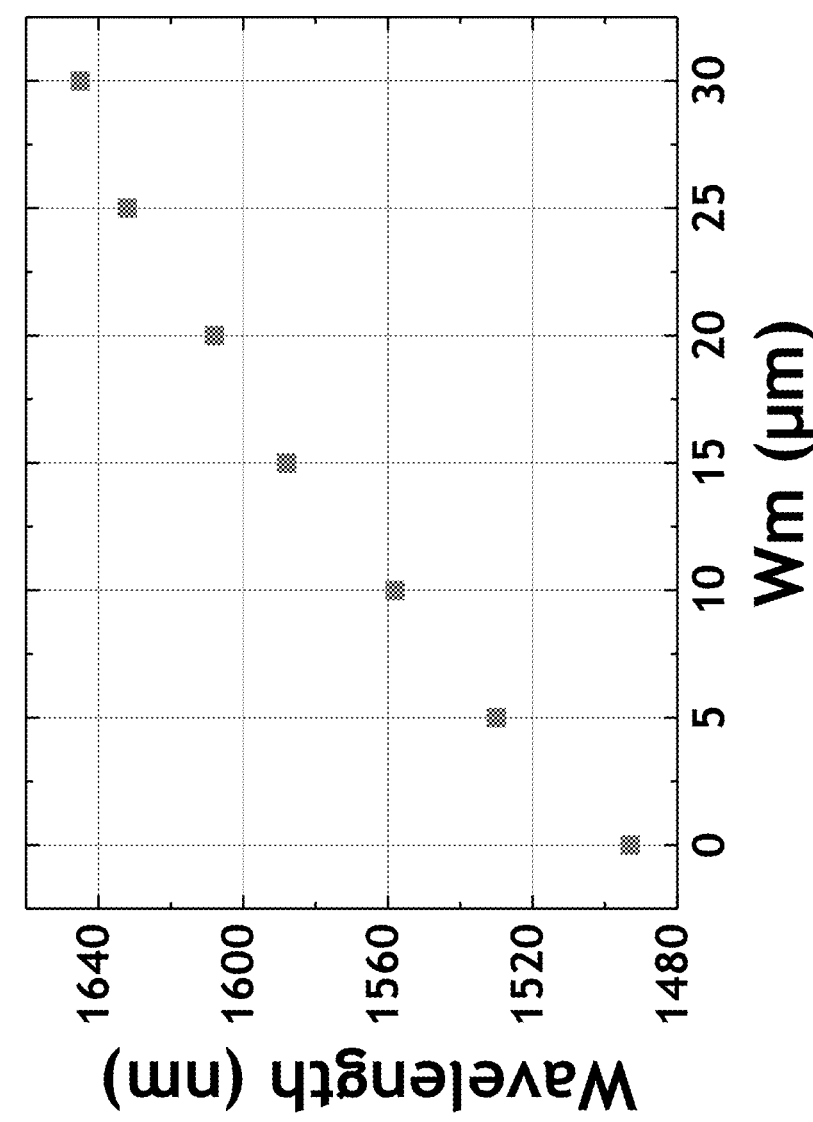
FIG. 8 is a plot of wavelength vs mask width of the photodetector receiver of FIG. 3.

FIG. 8 illustrates exemplary calibration curves, in which the y-axis (left) is the measured photoluminescence (PL or $\lambda$), which is plotted vs the x-axis, which is the width W of the mask stripes $41_1$ to $41_n$. The responsivity of the WDM photodetector receiver 21, i.e. the responsivity to the specific wavelengths in each PD section, the wavelengths $\lambda_1$ to $\lambda_n$ absorbed thereby, can be tuned and adjusted by varying the widths of the SAG regions $42_1$ to $42_n$.

Figures 9A, 9B, 9C:
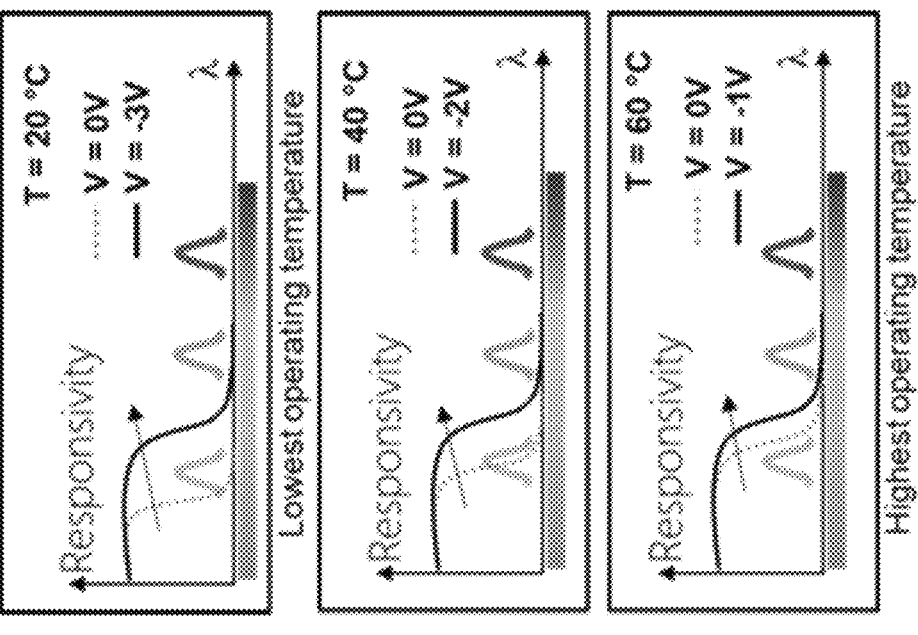
FIGS. 9A to 9C illustrate responsivity curves of the photodetector receiver of FIG. 3 at various temperatures and input voltages.

In an athermal WDM system, e.g. CWDM or DWDM, both the transmitter 10 and the receiver 5 may be at different temperatures. The absorption band edge of the different PD sections, e.g. PD1 to PD4, may be redshifted by greater than or equal to about 0.6 nm/° C., inducing a greater than or equal to about 36 nm shift across a 60° C. range. In order to overcome this issue in some embodiments, the absorption band edge of the different PD sections, e.g. PD1 to PD4, may be adjusted in order to operate at different, e.g. lower, voltages at different, e.g. higher, temperatures. Then, if the temperature is decreased, the blueshift can be compensated by applying a slightly higher voltage in the PD sections, e.g. PD1 to PD4. A schematic of the PD's response is shown in FIGS. 9A, 9B and 9C for temperatures of 20° C., 40° C. and 60° C., respectively, for two different operating voltages. As illustrated, at 20° C., the optimum absorption edge for the first wavelength $\lambda$ is achieved by applying a voltage lower at 60° C. (V=−1V) as compared to the one used at 20° C. (V=−3V). This point can be easily handled by adjusting the bandgap of each PD section, e.g. the MQW absorbing media structures $32_1$ to $32_n$, using the SAG technique.

At 20° C. (FIG. 9A) −3V may be applied to optimize the absorption of the first wavelength ($\lambda_1$). When the temperature is increased, the absorption band edge moves towards higher wavelengths (the energy bandgap is reduced) so the application of less voltage is required to optimize the absorption, e.g. qualitatively, −2V at 40° C. and only −1V at 60° C. Accordingly, when designing the different PD sections PD1 to PDn, e.g. the MQW absorbing media structures $32_1$ to $32_n$, the different bandgaps, can be adjusted according to the temperature range at which the devices will work, i.e. the position of the band-edge absorption may be tuned using the SAG method.

LIST OF ABBREVIATIONS

VCSEL Vertical Cavity Surface Emitting Lasers
WDM Wavelength Division Multiplexing PIC Photonic Integrated Circuit DFB Distributed Feedback MQW Multiple Quantum Well PD Photodiode SAG Selective Area Growth MOVPE Metal Organic Vapor Phase Epitaxy The foregoing description of one or more example embodiments has been presented for the purposes of illustration and description. It is not intended to be exhaustive or to limit the invention to the precise form disclosed. Many modifications and variations are possible in light of the above teaching. It is intended that the scope of the disclosure be limited not by this detailed description.

The invention claimed is:

1. A wavelength division multiplexor (WDM) photodetector receiver, comprising:

cascaded-bandgap waveguide photodetector sections with multiple concatenated bandgaps, arranged from lowest wavelength to highest wavelength, based on Multiple Quantum Well (MQW) absorbing media, each photodetector section configured for a corresponding different single wavelength in bandgap and length, wherein the cascaded-bandgap waveguide photodetector sections are aligned and connected into concatenated photodetector sections forming a single elongated optical waveguide adapted for guiding an incoming signal successively through each waveguide photodetector section, wherein a respective minimum photodetector length is defined for absorbing a respective single wavelength, and at least one of the photodetector sections is configured longer than a corresponding respective minimum photodetector length for absorbing the respective corresponding different single wavelength.

2. The WDM photodetector receiver according to claim 1, further comprising an upper layer comprising one of a p-doped material or an n-doped material covering the photodetector sections; and a substrate, which is p-doped or n-doped, supporting the photodetector sections;

wherein the upper layer, the photodetector sections, and the substrate form a PIN junction.

3. The WDM photodetector receiver according to claim 1, wherein each photodetector section has substantially a same width, and wherein each photodetector section has a different thickness.

4. The WDM photodetector receiver according to claim 1, wherein each photodetector section is isolated electrically from each other via an insulating segment.

5. The WDM photodetector receiver according to claim 4, wherein each insulating segment comprises an implantation of H+ between adjacent photodetector sections.

6. The WDM photodetector receiver according to claim 1, wherein the cascaded-bandgap waveguide photodetector sections are configured such that an optical path entering the WDM photodetector receiver enters a cascaded-bandgap waveguide photodetector section having a lowest wavelength among the cascaded-bandgap waveguide photodetector sections before entering the other cascaded-bandgap waveguide photodetector sections.

7. The WDM photodetector receiver according to claim 1, wherein each cascaded-bandgap waveguide photodetector section is on a different portion of a substrate adjacent to each other arranged from lowest wavelength to highest wavelength.

8. The WDM photodector receiver according to claim 1, wherein the WDM photodetector receiver is optically connected to a transmitter via an optical network.

9. A method of fabricating a wavelength division multiplexor (WDM) photodetector receiver, comprising:

a) providing a substrate;

b) providing a plurality of pairs of selective mask stripes with a trench therebetween on the substrate, each pair of mask stripes having a different width;

c) providing an absorbing material in each trench forming a plurality of photodetector sections at a same time, whereby the different width of each pair of mask stripes results in a different thickness of each photodetector section and a different bandgap of each photodetector section;

d) separating the plurality of photodetector sections; and e) connecting the plurality of photodetector sections into concatenated photodetector sections forming a single elongated optical waveguide.

10. The method according to claim 9, wherein the absorbing material comprises multiple quantum well (MQW) absorbing media.

11. The method according to claim 10, wherein step c) includes selective area growth (SAG) by metalorganic vapor phase epitaxy (MOVPE).

12. The method according to claim 9, further comprising covering the optical waveguide with an upper layer comprising one of a p-doped material or an n-doped material;

wherein the substrate is p-doped or n-doped; and wherein the upper layer, the optical waveguide and the substrate comprise a PIN junction.

13. The method according to claim 9, wherein step e) includes positioning a waveguide-defining mask over the absorbing material forming the plurality of photodetector sections and etching each side thereof to form the single optical waveguide.

14. The method according to claim 9, wherein step b) includes forming each trench about a same width.

15. The method according to claim 9, wherein step b) comprises coating the substrate with a masking material, and selectively etching the plurality of pairs of selective mask stripes from the masking material.

16. The method according to claim 9, wherein further comprising implanting H+ between adjacent photodetector sections for electrically insulating each photodetector section.

17. The method according to claim 9, further comprising configuring the bandgap of each photodetector section based on an operating temperature range of the WDM photodetector receiver.

* * * * *